United States Patent
Taylor et al.

(10) Patent No.: US 7,023,268 B1
(45) Date of Patent: Apr. 4, 2006

(54) SYSTEMS AND METHODS FOR AUTOMATICALLY ADJUSTING CHANNEL TIMING

(75) Inventors: Wilson E. Taylor, Austin, TX (US); Jack B. Andersen, Austin, TX (US); Michael Rovner, Austin, TX (US); Michael A. Kost, Austin, TX (US)

(73) Assignee: D2Audio Corporation, Austin, TX (US)

( * ) Notice: Subject to any disclaimer, the term of this patent is extended or adjusted under 35 U.S.C. 154(b) by 68 days.

(21) Appl. No.: 10/805,741

(22) Filed: Mar. 22, 2004

Related U.S. Application Data

(60) Provisional application No. 60/456,421, filed on Mar. 21, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H03F 3/38* (2006.01)

(52) U.S. Cl. .................................................. 330/10
(58) Field of Classification Search ............... None
See application file for complete search history.

(56) References Cited

U.S. PATENT DOCUMENTS

| | | | | |
|---|---|---|---|---|
| 4,554,512 A | * | 11/1985 | Aiello | 330/10 |
| 6,294,954 B1 | * | 9/2001 | Melanson | 330/10 |
| 6,373,334 B1 | * | 4/2002 | Melanson | 330/10 |
| 6,737,917 B1 | * | 5/2004 | Ryoo et al. | 330/10 |
| 2004/0184627 A1 | * | 9/2004 | Kost et al. | 381/120 |

* cited by examiner

Primary Examiner—Robert Pascal
Assistant Examiner—Krista M. Flanagan
(74) Attorney, Agent, or Firm—Law Offices of Mark L. Berrier

(57) ABSTRACT

Systems and methods for automatically adjusting the alignment of high-side and low-side pulse width modulated signals to improve dead time and shoot-through conditions. In one embodiment, a system includes a digital amplifier controller, an amplifier output stage coupled to the controller and configured to receive audio signals from the controller, and one or more sensors coupled to the output stage. The sensors are configured to detect and/or measure various parameters, such as shoot-through current and distortion, which are associated with the operation of the output stage. The sensors provide feedback to an internal processor or modulator of the controller, which then adjusts the timing of the high-side and low-side signals to improve the operating conditions of the output stage by minimizing shoot-through current and/or distortion.

2 Claims, 4 Drawing Sheets

SYSTEMS AND METHODS FOR AUTOMATICALLY ADJUSTING CHANNEL TIMING

RELATED APPLICATIONS

This application claims priority to U.S. Provisional Patent Application No. 60/456,421, entitled "Output Device Switch Timing Correction," by Taylor, et al., filed Mar. 21, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; U.S. patent application Ser. No. 10/805,594, entitled "Systems and Methods for Protection of Audio Amplifier Circuits," by Kost, et al., filed Mar. 19, 2004; each of which is fully incorporated by reference as if set forth herein in its entirety.

BACKGROUND

1. Field of the Invention

The invention relates generally to audio amplification systems, and more particularly to systems and methods for automatically adjusting the alignment of high-side and low-side pulse width modulated signals to improve dead time and shoot-through conditions.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in low performance applications. These applications were complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

One of the problems with prior art systems and methods is that they do not provide a mechanism for automatically adjusting the timing of signals provided to the output stage of a PWM amplifier. A typical PWM amplifier includes a PCM-to-PWM modulator that receives a PCM audio signal and generates a pair of PWM signals. The signals are provided to a driver, which drives each of the signals to a corresponding FET (field effect transistor) in the output stage. One of the PWM signals is a high-side signal that drives a high-side FET, and the other signal is a low-side signal that drives a low-side FET. Each of the PWM signals turns the corresponding FET on and off. Generally speaking, the signals are intended to turn the FETs on and off alternately. In other words, when the high-side FET is turned on, the low-side FET should be turned off, and vice versa. (It should be noted that, while the present embodiment uses FETs, other embodiments may use other types of transistors.)

The FETs, however, do not turn on and off instantaneously, but instead require a certain amount of time to change between the "on" state and the "off" state. There may therefore be some overlap between the times each of the FETs is turned on. If there is little overlap, a "dead time" is introduced during which the signal produced by the output stage does not follow the input signal—and thus distortion is created. If there is a substantial amount of overlap, there will generally be less distortion, but the output stage may draw a great deal of current because both FETs are turned on and the current is allowed to flow essentially directly from a voltage source to ground. This current is referred to as "shoot-through" current. It is desirable to be able to adjust the amount of overlap between the signals in order to control the balance of the dead time and shoot-through current. This is particularly true since there are a number of factors that cause variations in the delays incurred by each of the signals, including component variations, environmental conditions (e.g., temperature), etc.

In conventional PWM amplifiers, the relative timing of the high-side and low-side signals is adjusted by means of analog components, such as the resistors and capacitors in an RC circuit. These components are not repeatedly adjusted, but are instead adjusted a single time (e.g., in the lab). After this one-time adjustment, the timing is not changed any more. As a result, even if the initial adjustment were exactly optimal, factors that change during the life of the product (e.g., aging of the components, changes in temperature during operation, etc.) may cause the timing itself to change. Now one-time adjustment may therefore no longer achieve the desired balance of dead time and shoot-through current.

It would therefore be desirable to provide a mechanism for automatically adjusting the relative timing of the high-side and low-side channels to achieve optimal timing for the current conditions.

SUMMARY OF THE INVENTION

One or more of the problems outlined above may be solved by the various embodiments of the invention. Broadly speaking, the invention comprises systems and methods for automatically adjusting the alignment of high-side and low-side pulse width modulated signals to improve dead time and shoot-through conditions.

One embodiment of the invention comprises a system having a digital amplifier controller, an amplifier output stage coupled to the controller and configured to receive audio signals from the controller, and one or more sensors coupled to the output stage. The sensors are configured to detect and/or measure various parameters (e.g., shoot-through current and distortion) associated with the operation of the output stage and to provide feedback to the controller, which then adjusts the timing of the high-side and low-side signals to improve the operating conditions of the output stage.

In one embodiment, a system as described above is implemented in a pulse width modulated (PWM) amplification system. This system may detect conditions such as shoot-through current and distortion, which may be improved (i.e., minimized) by adjusting the relative timing of high-side and low-side signals that are input to a PWM output stage to generate an amplified output signal.

One embodiment comprises a method implemented in a digital PWM amplifier including the steps of determining one or more electrical characteristics associated with the operation of the amplifier and adjusting the relative timing between a high-side signal and a low-side signal in the amplifier to minimize dead time and shoot-through current in the amplifier. In various embodiments, the measured electrical characteristics associated with the operation of the amplifier may include differential current measured at an output of the amplifier, shoot-through current in the output stage of the amplifier or distortion in the output of the amplifier. The dead time and shoot-through may be optimized, for example, by decreasing dead time until shoot-though current exceeds a threshold level, then increasing the dead time until a threshold of acceptable distortion is reached. The measurement of the dead time, shoot-through or other metric and the subsequent adjustment of the channel timing may be repeated, and may be performed at power-up or during operation.

Numerous additional embodiments are also possible.

The various embodiments of the invention may provide a number of advantages over the prior art. For example, rather than being constrained to predetermined timing that is set in a laboratory environment, the present systems and methods allow for optimization in response to currently prevailing conditions. Thus, the timing can be automatically re-optimized in response to various factors, such as aging of components, variations in temperature, etc. Still other advantages will be apparent to those of skill in the art of the invention.

BRIEF DESCRIPTION OF THE DRAWINGS

Other objects and advantages of the invention may become apparent upon reading the following detailed description and upon reference to the accompanying drawings.

Figure 1:
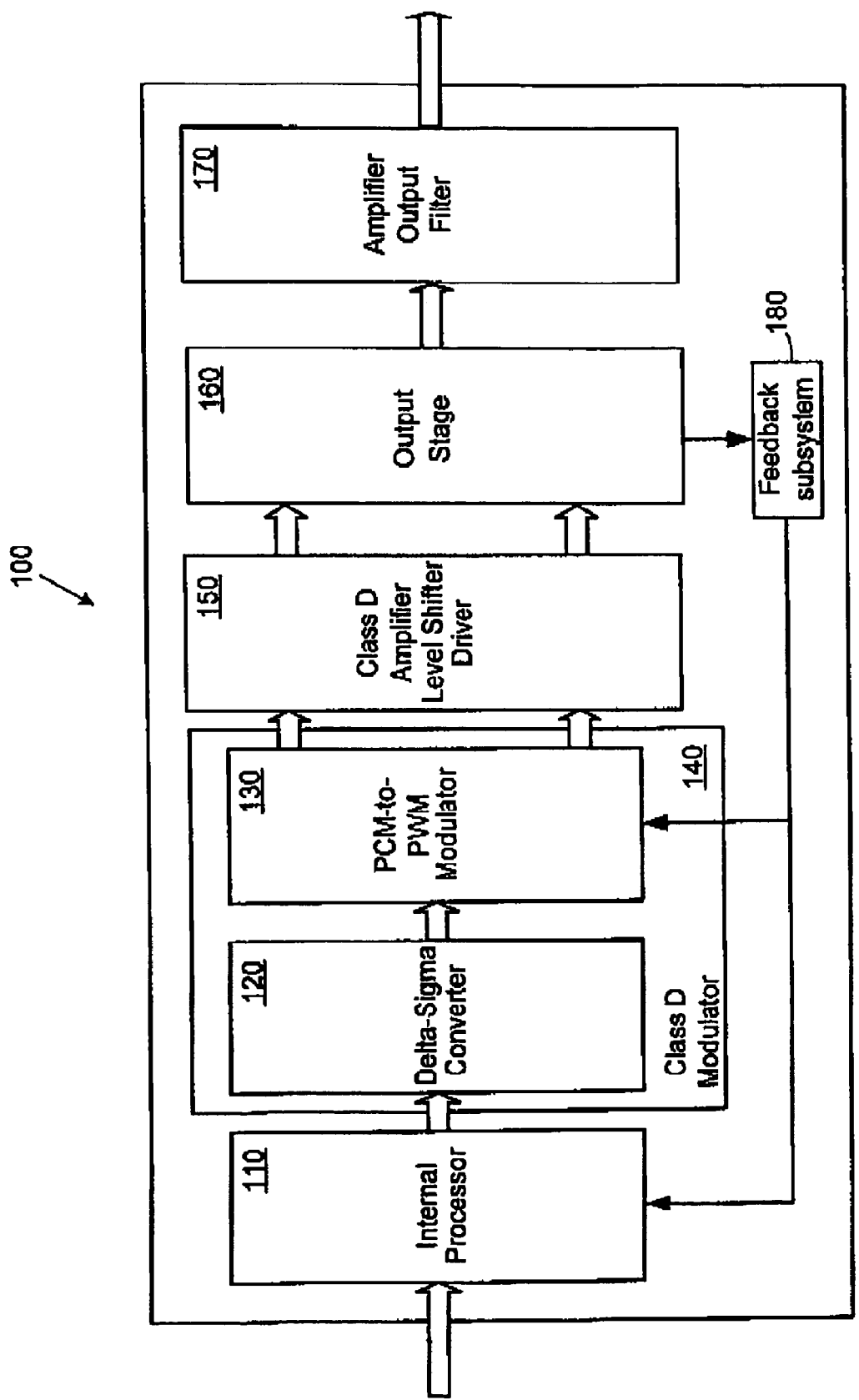
FIG. 1 is a functional block diagram illustrating a PWM amplification system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for automatically adjusting the alignment of high-side and low-side pulse width modulated signals to improve dead time and shoot-through conditions.

One embodiment comprises a method for adjusting the relative timing of high-side and low-side signals in a digital PWM amplifier. Because the FETs in the output stage of the PWM amplifier do not switch perfectly (i.e., they do not switch instantaneously between being completely turned on and completely turned off), there is a period of time during which the FETs transition from a state in which a first one is turned on and a second one is turned off, to a state in which the first one is turned off and the second one is turned on. Depending upon the amount of time it takes for each FET to transition from one state to another and the amount by which the transitions of the two FETs overlap, there may be a certain amount of shoot-through current and distortion that results.

The shoot-through current arises when both FETs in the output stage are turned on at the same time. In other words, one FET begins to turn on before the other FET is completely turned off. If both FETs are turned on, current "shoots through" both FETs from the voltage source to ground. The greater the overlap in time that both FETs are turned on, the greater the magnitude of the shoot-through current. Because the current that shoots through the FETs is wasted, it is desirable to minimize the shoot-through current. This is done by adjusting the relative timing of the high-side and low-side signals that turn the respective FETs on and off to minimize the overlap of the two FETs being turned on. The distortion, on the other hand, arises in the case when one FET begins to turn off, while the other FET is not yet completely turned on. In other words, there is a certain amount of "dead time" in the transition between one FET being turned on and the other being turned off, and vice versa. Because neither of the FETs is completely turned on during the dead time, the output stage cannot accurately reproduce the audio signal. The distortion is minimized by adjusting the relative timing of the high-side and low-side signals that turn the respective FETs on and off to reduce the dead time in the transition between on and off states.

The problem with adjusting the relative timing of the high-side and low-side signals is that shoot-through and dead time optimization require opposite adjustments. That is, adjusting the timing so that one FET turns off completely before the other one turns on minimizes shoot-through current, but increases dead time and distortion. Conversely, adjusting the timing so that one FET turns on completely before the other one turns off minimizes dead time and distortion, but increases shoot-through current. It is therefore necessary to balance the considerations of shoot-through and dead time to achieve an optimal relative timing adjustment between the high-side and low-side signals.

This is accomplished in one embodiment by measuring the shoot-through current and distortion during the operation of the amplifier, processing these measurements and adjusting the relative timing to optimize shoot-through and distortion for the prevailing conditions. It is important to note that, because the prevailing conditions may vary from the initial or anticipated operating conditions of the amplifier, the automatic adjustment of the timing at device startup or during operation can provide substantially improved performance over the one-time adjustment that is typical for prior art systems.

Referring to FIG. 1, a functional block diagram illustrating a PWM amplification system in accordance with one embodiment of the invention is shown. As depicted in the figure, PWM amplification system 100 comprises an internal processor 110, a delta-sigma converter 120, a PCM-to-PWM modulator 130, a Driver 150, an output stage 160, an output filter 170 and a feedback subsystem 180. Delta-sigma converter 120 and PCM-to-PWM modulator 130 form a Class D modulator 140.

A digital audio signal is first input to internal processor 110. Internal processor 110 performs audio processing on the digital audio signal. The internal processor 110 may perform various types of processing on the signal, including the modification of the signal in response to a detected failure condition of the system. This will be discussed in more detail below. The processed digital audio signal is then converted to a 1-bit digital data stream by Class D modulator 140. This 1-bit data stream is characterized by two control signals that are output to driver 150, which then uses the signals to drive the upper and lower switches of output stage 160. The signal produced by output stage 160 is then processed by output filter 170. The signal output by filter 170 can then be used to drive a speaker system (not shown).

The control signals generated by modulator 140 are typically aligned exactly. In other words, the digital transition of one control signal from 0 to 1 is exactly aligned with the transition of the other control signal from 1 to 0. As these signals are processed by driver 150, however, component tolerances, temperature variations and other factors may cause one of the signals to be delayed more than the other. As a result, the alignment of the processed control signals may be skewed before the signals are provided to output stage 160. These same factors may also cause the transitions (from 0 to 1 and from 1 to 0) to be more gradual, so that the FETs out of output stage are turned on and off more slowly. Feedback subsystem 180 is coupled to output stage 160 in order to obtain information on the performance out of output stage 160 with respect to the relative timing of the control signals. For instance, feedback subsystem 180 may obtain measurements of the shoot-through current through the FETs and/or distortion of the output of output stage 160, both of which are affected by the relative timing of the control signals, as described above. Feedback subsystem 180 may process this information and provide a simplified output to processor 110 or modulator 140, or it may provide raw data to processor 110 or modulator 140 and allow these components of the system to process the data and take appropriate actions with respect to the timing of the control signals.

Figure 2:
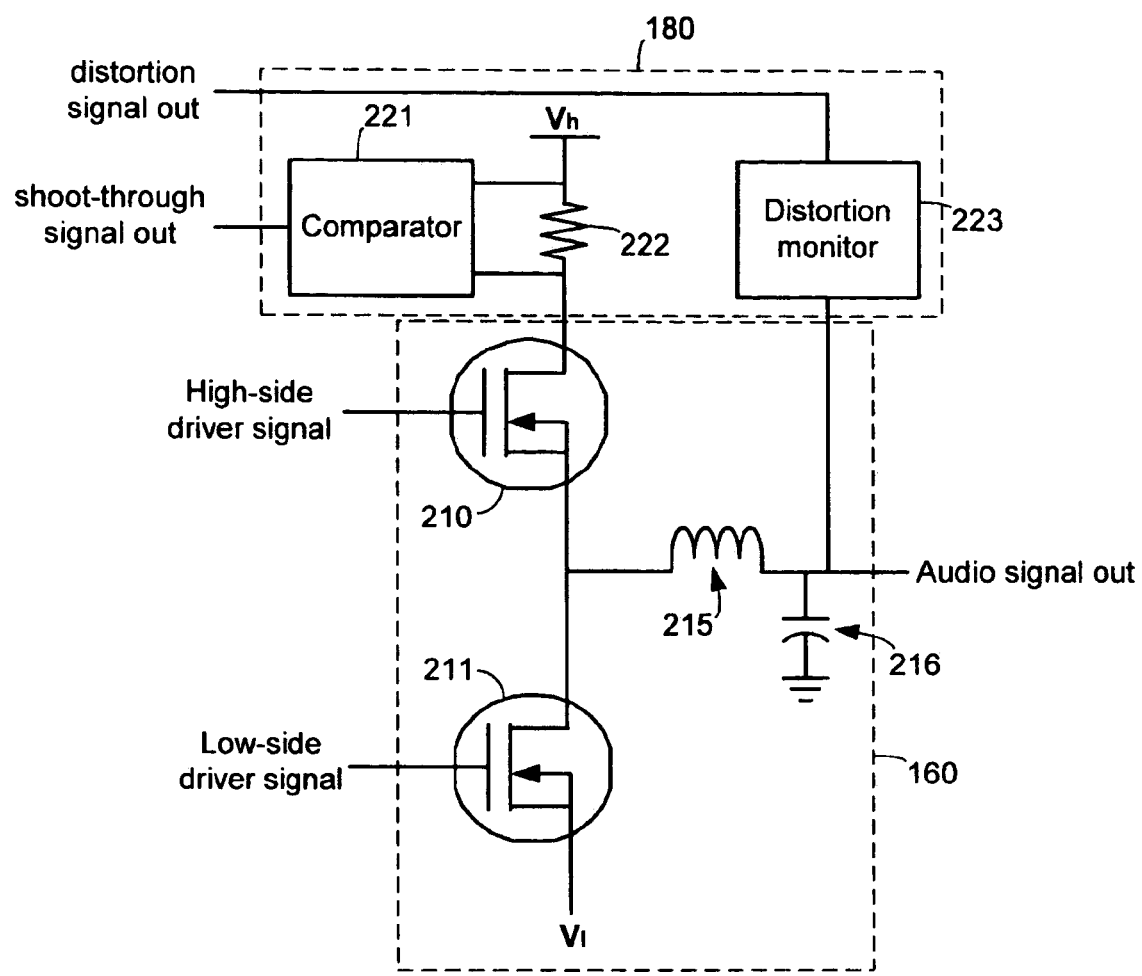
FIG. 2 is a diagram illustrating the interrelation of the output stage and the feedback subsystem in accordance with one embodiment.

Referring to FIG. 2, a diagram illustrating the interrelation of the output stage and the sensor subsystem in accordance with one embodiment is shown. It should be noted that, for the purposes of clarity, the diagram only shows the major components of the output stage and sensor subsystem.

In FIG. 2, the output stage components consist primarily of high-side FET 210, low-side FET 211, inductor 215 and capacitor 216. As described above, the driver circuit provides a high-side signal and a low-side signal to the output stage. The high-side signal drives FET 210, while the low-side signal drives FET 211. The high-side and low-side signals alternately switch FETs 210 and 211 on and off to generate a single signal that is modulated between $V_l$ and $V_h$. This signal is filtered by inductor 215 and capacitor 216 before being provided as an output signal. In the depicted embodiment, the output stage also includes feedback subsystem components comparator 221, resistor 222 and distortion monitor 223, which will be discussed in more detail below.

Figure 3:
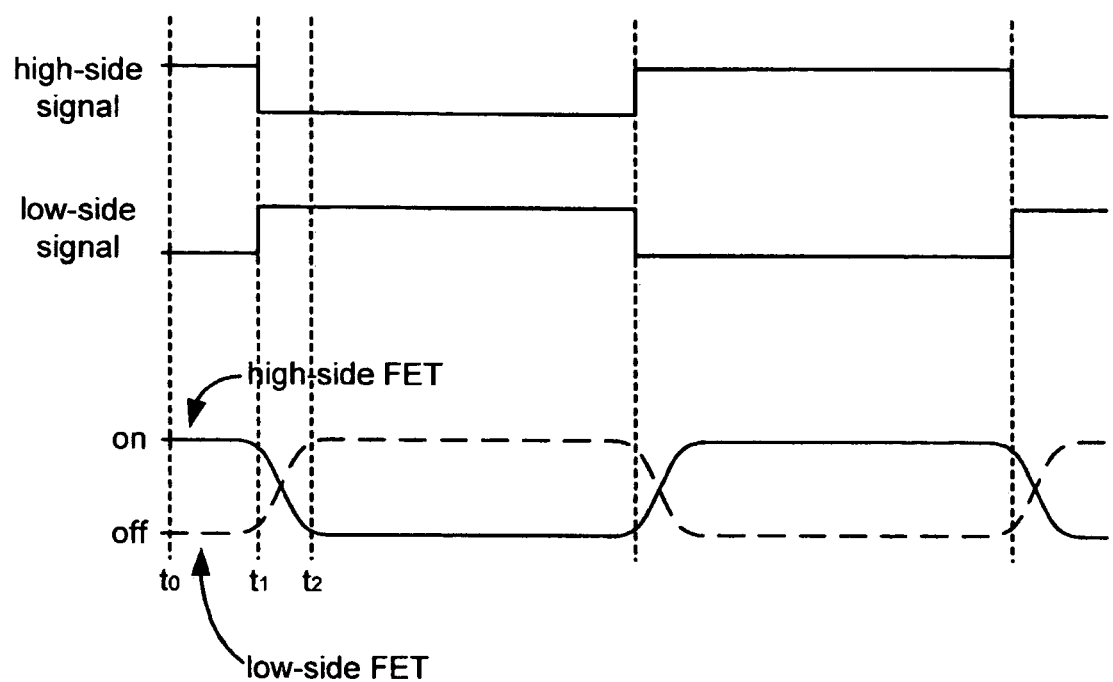
FIG. 3 is a diagram illustrating the correspondence of the control signals generated by a PWM modulator to the states of the output stage FETs in accordance with one embodiment.

Referring to FIG. 3, a diagram illustrating the correspondence of the control signals generated by a PWM modulator to the states of the output stage FETs in accordance with one embodiment is shown. It should be noted that the control signals and FET states shown in this figure are presented for the purpose of describing shoot-through and dead time, and do not include timing adjustments of the type that are made by the present systems and methods.

The control signals generated by the PWM modulator are shown at the top of the figure. It can be seen that the control signals are, for the purposes of this example, inverses of each other. In other words, when one is high, the other is low, and vice versa. The transitions of the control signals shown in the figure are exactly aligned with each other. The states of the FETs of the output stage are shown at the bottom of FIG. 3. It can be seen that, when the control signal for one of the FETs transitions, the corresponding FET transitions as well. The FET, however, requires a certain amount of time to transition from one state to another, rather than changing instantaneously with the control signal. Thus, at time t1, the high-side control signal transitions from high to low, but the high-side FET has only began to make the transition from being turned on to being turned off. It is not until time t2 that the high-side FET is almost completely turned off.

Figure 4:
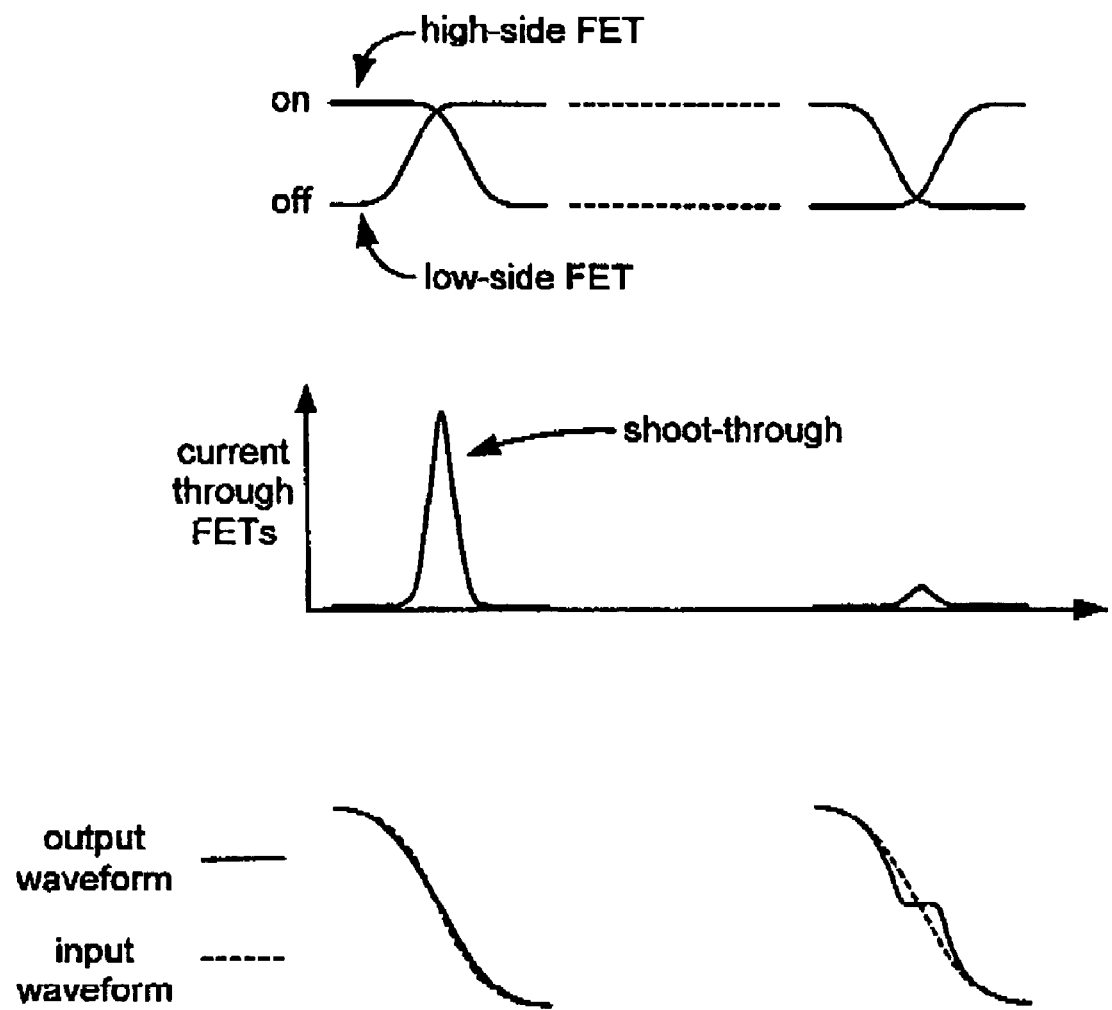
FIG. 4 is a diagram illustrating the shoot-through and distortion effects of the state transition of the FETs in accordance with one embodiment.

Referring to FIG. 4, a diagram illustrating the shoot-through and distortion effects of the state transition of the FETs is shown. At the top of this figure, two transitions are shown for the FETs, with the high-side FET transitioning from being turned on to being turned off, and the low-side FET transitioning from being turned off to being turned on. The left side of the figure corresponds to a situation in which the low-side FET begins to turn on before the high-side FET begins to turn off. There is therefore substantial overlap between the two FETs being turned on. As a result, current is allowed to shoot through the FETs. The current through the FETs is illustrated in the middle of the figure. While this situation allows a great deal of shoot-through current, it causes little distortion in the output signal, as shown at the bottom of the figure.

The right side of the FIG. 4 corresponds to a situation in which the high-side FET begins to turn off before the low-side FET begins to turn on. There is therefore little overlap between the two FETs being turned on. Instead, there is a period in which both FETs are almost completely turned off (dead time). In this situation, there is little shoot-through current, as shown in the middle, right-hand portion of the figure. There is a substantial amount of distortion that arises from the dead time, as shown in the bottom, right-hand portion of the figure.

Rather than operating in regions corresponding to the illustrations of FIG. 4, which result in either substantial shoot-through or substantial distortion, it is desirable to operate in a region which minimizes both shoot-through and distortion. This is accomplished by adjusting the times at which the FETs turn on and off with respect to each other, so that the overlap and/or dead time, and consequently the shoot-through current and distortion, are controlled and held within acceptable limits. The embodiment of the invention therefore detect conditions such as shoot-through current and distortion and provide this information as feedback to processing elements that automatically adjust the relative timing of the high-side and low-side control signals in response to the feedback and thereby achieve a desired balance between shoot-through current and distortion, even if conditions affecting shoot-through and distortion change over time.

Referring again to FIG. 2, the feedback subsystem consists of comparator 221, resistor 222 and distortion monitor 223. Comparator 221 and distortion monitor each produces a protection feedback signal in this embodiment. Comparator 221 produces a signal associated with the shoot-through current that passes through FETs 210 and 211, while distortion monitor 223 produces a signal associated with distortion in the output signal generated by the output stage.

In this embodiment, comparator 221 simply determines the shoot-through current by measuring a voltage drop across resistor 222. Normally, only one of FETs 210 and 211 is turned on at any time, so current flows through one or the other, but not both, and the current is relatively small. When both FETs are turned on at the same time, the current is much greater than the current that flows through a single one of the FETs. This dramatically increases the power consumption of the amplifier. In one embodiment, current spikes corresponding to shoot-through are detected using a single resistor-comparator pair, but alternative embodiments can use both high-side and low-side resistor-comparator pairs to detect shoot-through. As noted above, comparator 221 may either process this measurement and provide a derivative indication as the shoot-through feedback signal, or it may provide the voltage measurement itself as feedback.

Distortion monitor 223 may determine the distortion in various ways. In one embodiment, distortion monitor 223 measures the third harmonic of a test signal that is fed through the amplifier channel. Because the input test signal has no harmonics, the amplitude of the third harmonic is a simple, but effective measure of the distortion. As with the shoot-through feedback, this distortion measurement itself or a derivative metric may be passed to the processor or modulator as feedback. Alternatively, the feedback could be provided to an intermediate feedback processor, which could then provide feedback to the processor or modulator. As another alternative, the distortion monitor could be an analog-to-digital converter (ADC) that samples the audio signal. The samples could be fed back to the internal processor, which could then calculate the amount of distortion present in the audio signal. It should therefore be clear that the feedback subsystem of FIG. 2 is exemplary and could be implemented in other ways in other embodiments.

In one embodiment, the system is configured with one shoot-through channel per audio channel. As described above, one embodiment of a PWM amplification system generates high-side and low-side pulses that turn on high-side and low-side FETs in an output stage. The timing of the high-side and low-side pulses may be adjusted to result in more or less overlap between the pulses. If the pulses overlap, both the high-side and low-side FETs are turned on, and current can rapidly flow through the two FETs (i.e., there may be shoot-through current.) On the other hand, if the high-side and low-side pulses are not overlapped, one of the FETs is turned off before the other is turned on. There is therefore a period during which both FETs are off and there is little or no current flowing through the FETs (i.e., dead time.)

In this embodiment, shoot-through calibration is performed before the audio channel begins normal operation. The calibration is performed to achieve relative timing between the high-side and low-side pulses that neither wastes too much power because of shoot-through current, nor causes too much distortion arising from dead time between the pulses. The calibration is performed by setting the dead time between high-side and low-side pulses to a predetermined maximum value (i.e., setting the pulses to overlap by a predetermined amount) and then gradually reducing the dead time (adjusting the timing between the pulses) until shoot-through occurs at a threshold level. The system then readjusts the relative delays between the high-side and low-side signals to "back off" from the overlap that caused the shoot-through condition. This "backing off" is accomplished by reducing the overlap (i.e., increasing the dead time between high-side and low-side signals) by a predetermined amount. An exemplary algorithm for shoot-through calibration is shown below.

```
setMaxDeadtime( );
repeat
{
   resetDetect( );
   runPWM( );
   shortenDeadtime( );
} until (shootThroughDetected( )==1)
expand Deadtime( );
```

As used in this algorithm, the setMaxDeadtime( ) function sets the high-side and low-side signal delays so that the dead time between high-side and low-side pulses is at the predetermined maximum value. The shortenDeadtime( ) function incrementally decreases the dead time, while the expandDeadtime( ) function increases the dead time by a predetermined amount.

In the embodiment described above, the calibration of the relative channel timing is based only on the measurement of shoot-through current. As pointed out above, the measurement of shoot-through current alone may not result in optimal distortion. It is simply assumed that backing off by a predetermined amount from the threshold level of shoot-through current will not increase distortion above an acceptable level. In an alternative embodiment, however, it is possible to optimize the channel timing based on measurements of both the shoot through current and the distortion.

For example, in one embodiment, a method can implement an algorithm that is similar to the algorithm above, but is constrained by a distortion threshold as well as a shoot-through threshold. Thus, rather than expanding the dead time by a predetermined amount, the dead time is expanded only so long as the resulting distortion remains less than or equal to a threshold value. An exemplary algorithm for shoot-through calibration is shown below.

```
setMaxDeadtime( );
repeat
{
   resetDetect( );
   runPWM( );
   shortenDeadtime( );
} until (shootThroughDetected( )==1)
expandDeadtime( );
while(distortion( )<C_THRESHOLD)
``` increaseDeadTime( )
decreaseDeadTime( )

If this algorithm were implemented, dead time would be reduced until unacceptable shoot-through is detected. At that point, dead time would be increased until performance was unacceptable. The dead time would then be reduced again. This algorithm searches for optimal relative channel timing by optimizing shoot-through current first, and audio performance second. Alternatively, it is possible to optimize for distortion first and shoot-through second, as shown by the following exemplary algorithm:

setMaxDeadtime( )
while(distortion( )>C_THRESHOLD)
  decreaseDeadTime( );
if(shootThroughDetect( )==1)
  expandDeadTime( );

While the exemplary methods described above are designed to make use of relatively direct measurements of shoot-through current and distortion, indirect measurements or metrics could be used as well. For example, in one embodiment, control signals having a 50% duty cycle could be generated. The FETs would then be turned on and turned off for equal amounts of time. In this situation, the output of the output stage would have no differential current (or DC offset.) If the relative channel timing varies, however, in a way that alters the 50% duty cycle at the output stage, each of the FETs will be turned on/off more than they are turned off/on. This difference in the amount of time the FETs are turned on/off will result in a differential current at the output of the output stage.

The system can therefore be configured to measure the differential current and to adjust the channel timing based on the measured current. The current can be measured using conventional current and/or voltage measurement techniques, including resistant, inductive or Hall-effect means. The measurements can be translated to appropriate signal levels and forwarded to the internal processor or modulator. The measurements of the differential current (as well as the shoot-through current and distortion in other embodiments) and the corresponding adjustments to the timing are performed iteratively. That is, a measurement is made and an adjustment based upon this measurement is made, then the measurement and adjustment steps are repeated.

While it is envisioned that, in one embodiment, the optimization of the relative channel timing will be accomplished in a calibration mode when the system is powered up, other embodiments may perform the optimization in real time during operation of the system. In the case of the power-up optimization, the method will establish optimal steady-state performance characteristics. In the case of the real-time optimization, the system may achieve optimal performance over varying temperature, signal levels, output loading, power supply and other variations. It should be noted that, while the embodiments described above are implemented in a two-switch, half-bridge topology, alternative embodiments may be implemented in other topologies, including full-bridge and three-state configurations.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
a PWM modulator;
a driver;
an output stage; and
feedback circuitry;
wherein the driver is coupled between the PWM modulator and the output stage, wherein the driver is configured to receive high-side and low-side PWM signals from the PWM modulator and to drive the high-side and low-side PWM signals to the output stages;
wherein the feedback circuitry is coupled between the output stage and the PWM modulator, wherein the feedback circuitry is configured to provide feedback associated with dead time and shoot-through current in the output stage to the PWM modulator, wherein the feedback circuitry is configured to measure shoot-through current in the output stage, wherein the feedback circuitry includes a resistor coupled in series with a pair of output stage transistors, and a comparator configured to measure a voltage drop across the resistor and compare the measured voltage drop to a threshold level; and
wherein the PWM modulator is configured to adjust the relative timing of the high-side and low-side PWM signals in response to the feedback to optimize the dead time and shoot-through current in the output stage.

2. A system comprising:
a PWM modulator;
a driver;
an output stage; and
feedback circuitry;
wherein the driver is coupled between the PWM modulator and the output stage, wherein the driver is configured to receive high-side and low-side PWM signals from the PWM modulator and to drive the high-side and low-side PWM signals to the output stage;
wherein the feedback circuitry is coupled between the output stage and the PWM modulator, wherein the feedback circuitry is configured to provide feedback associated with dead time and shoot-through current in the output stage to the PWM modulator, wherein the feedback circuitry is configured to measure shoot-through current in the output stage, wherein the feedback circuitry is configured to measure distortion in an output signal produced by the output stage, and wherein the feedback circuitry includes distortion circuitry configured to measure one or more harmonics of the output signal produced by the output stage; and
wherein the PWM modulator is configured to adjust the relative timing of the high-side and low-side PWM signals in response to the feedback to optimize the dead time and shoot-through current in the output stage.

* * * * *